INVENTORS
CHARLES J. BERTUCH
NORMAN H. MEYERS
HAROLD SOBOL
BY [signature]
ATTORNEY 3,202,833

SUPERCONDUCTIVE CIRCUIT

Charles J. Bertuch, Franklin Park, N.J., and Norman H. Meyers and Harold Sobol, Poughkeepsie, N.Y., assignors to International Business Machines Corporation, New York, N.Y., a corporation of New York Filed Jan. 18, 1961, Ser. No. 83,456
10 Claims. (Cl. 307—88.5)

Figure 1:
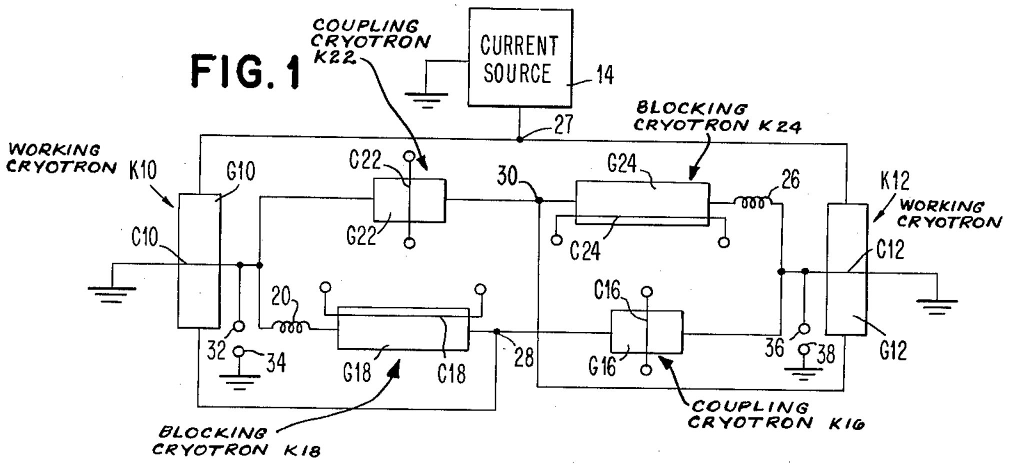

This invention relates to a superconductive switching circuit and more particularly to a universal superconductive multivibrator circuit.

The phenomenon of superconductivity, that is, the absence of electrical resistance which is exhibited by certain materials below predetermined temperatures, has been employed in the design of electrical circuits. Generally, each of these circuits employ a plurality of cryotron type devices. Briefly, a cryotron comprises a first, or gate, conductor, the resistance of which either superconducting or normal, is determined by a second, or control, conductor. The cryotron is operated at a sufficiently low temperature such that the gate conductor normally exhibits zero electrical resistance to the flow of an electrical current. Current flow of at least a predetermined magnitude through the associated control conductor is then effective to generate a magnetic field, which, when applied to the gate conductor, destroys superconductivity therein, and the gate conductor exhibits normal electrical resistance. The interconnection of a number of gate and control conductors is effective to form various amplifiers, oscillators and/or logical circuits. A more detailed discussion of cryotrons and superconductive circuits employing these devices is contained in an article by D. A. Buck entitled, "The Cryotron, a Superconductive Computer Component" published in the Proceedings of the IRE, Vol. 4, No. 4, April 1956 at pages 482–493.

An improved superconducting switching device is shown in co-pending application 625,512 filed November 30, 1956 on behalf of Richard L. Garwin and assigned to the assignee of this application. The gate and control conductors of these switching devices are each fabricated of thin superconductive films, insulated one from the other. The superconductive devices of the co-pending application are advantageously formed in quantity through the vacuum deposition of the necessary materials onto a substrate. However, superconductive circuits formed of either of these cryotron type devices are essentially fixed in their operation. That is, the only variables that can be employed to adjust the circuit operating time or frequency, are the amount of resistance introduced in a superconducting path due to one or more of the working gate conductors of the circuit, the inductance of the circuit, the length of the superconducting interconnection lines, and the physical properties such as the operating temperature and operating currents.

According to the invention, however, a universal superconductive multvibrator circuit has been developed, which is selectively operable as an astable multivibrator, a bistable multivibrator, and as a monostable multivibrator, wherein the timing of these multivibrators is determined and controlled by passive circuit elements. Moreover, these passive circuit elements are effective to shift the operating current between paths, independent of whether or not the path is wholly superconducting. These features are attained, as described in detail hereinafter, by circuitry employing resistors and inductors in a novel manner as the timing elements in this family of superconductive circuits. Additionally, by employing therein thin film resistors and inductors, the superconductive switching circuits of this application, in conjunction with the superconductive switching devices of the above referenced co-pending application, are also advantageously fabricated in quantity by the vacuum deposition of the necessary materials. Further, by making the necessary thin film resistors, themselves, in the form of cryotrons, it is possible, according to the invention, to form a universal superconductive multivibrator circuit, wherein the operation of the multivibrator circuit in either the astable, monostable, or bistable mode is selectively controlled by maintaining the thin film resistors, in conjunction with a further pair of cryotrons, in either the superconducting or resistive state.

Briefly described, the multivibrator of the invention includes a pair of working cryotrons, operable in parallel, which determine the state of the circuit. Further, a feedback network is incorporated which includes a pair of coupling cryotrons, a pair of blocking cryotrons, and a pair of inductors. The coupling cryotrons, when in the resistive state, function as the necessary thin film resistors, and the coupling cryotrons, when in the resistive state, are effective to remove the inductors from the circuit. By selectively energizing particular ones of the coupling and blocking cryotrons, the universal superconductive multivibrator circuit of the invention may be operated in any desired one of the three possible modes, all as explained in detail below.

It is an object of the invention to provide an improved superconductive switching circuit.

A more particular object of the invention is to provide a universal superconductive multivibrator circuit.

Another object of the invention is to provide superconductive switching circuits wherein the timing of the circuit is controlled by the circuit parameters.

A further object of this invention is to provide superconductive multvibrator circuits employing passive circuit elements.

Still another object of the invention is to provide a universal superconductive multivibrator circuit selectively operable in either the astable, monostable, or bistable mode.

Yet another object of the invention is to provide multivibrator superconductive circuits wherein a single control conductor serves as both the cross-latch and trigger input for the multivibrator.

Still another object of the invention is to provide a programmable superconductive multivibrator circuit.

The foregoing and other objects, features and advantages of the invention will be apparent from the following more particular description of a preferred embodiment of the invention, as illustrated in the accompanying drawings.

In the drawings:

FIG. 1 is a schematic diagram of the universal superconductive multivibrator circuit of the invention.

Figure 2A:
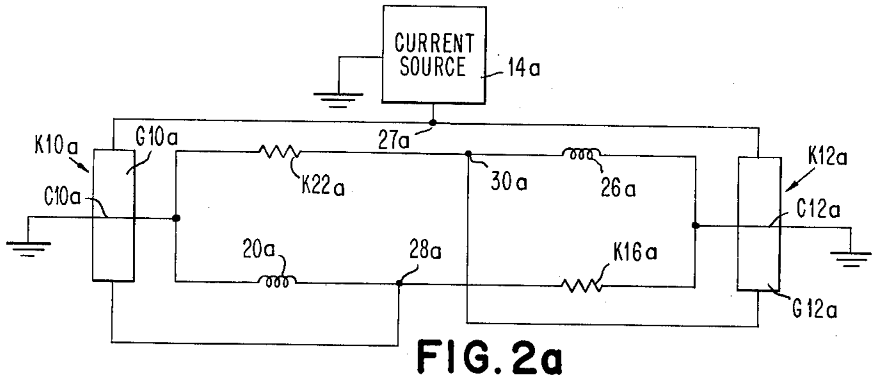

FIG. 2*a* is a schematic diagram of the circuit of FIG. 1 programmed as an astable multivibrator.

Figure 2B:
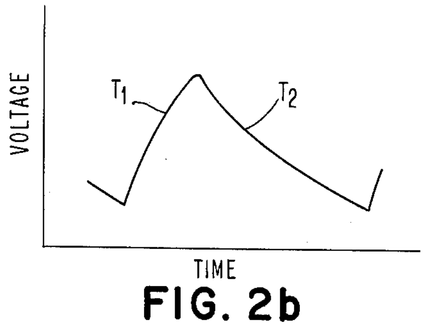

FIG. 2*b* is a timing diagram of the circuit of FIG. 2*a*.

Figure 3B:
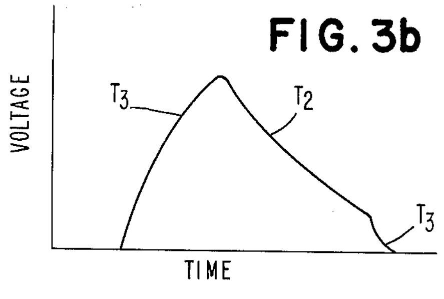
Figure 3A:
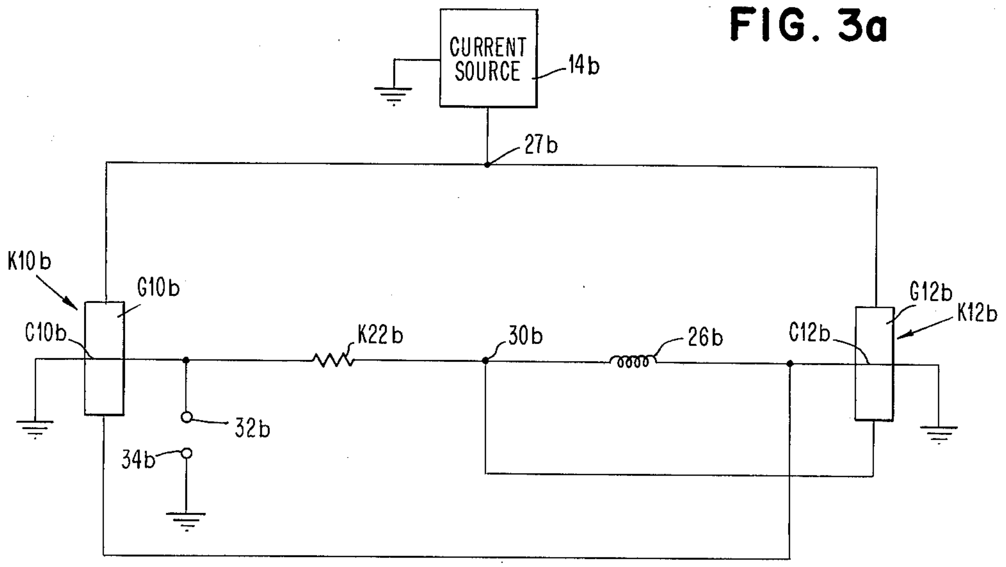

FIG. 3*a* is a schematic diagram of the circuit of FIG. 1 programmed as a monostable multivibrator.

FIG. 3*b* is a timing diagram of the circuit of FIG. 3*a*.

Figure 4:
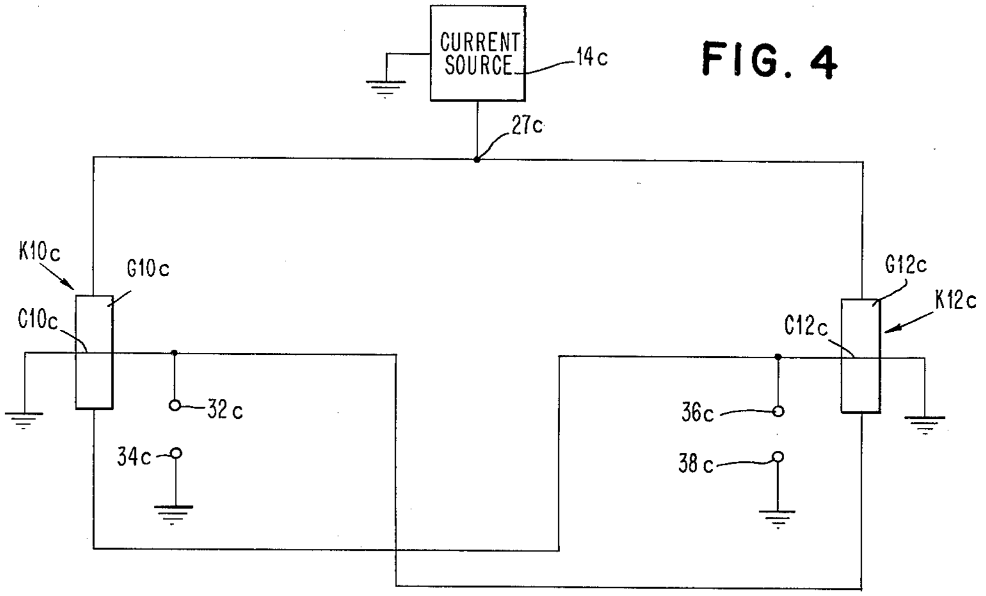

FIG. 4 is a schematic diagram of the circuit of FIG. 1 programmed as a bistable multivibrator.

Referring now to the drawings, FIG. 1 is a schematic diagram of the universal superconductive multivibrator of the invention, which is selectively operable to function as an astable multivibrator, a monostable multivibrator, or as a bistable multivibrator. As shown in FIG. 1, a pair of working cryotrons, K10 and K12, are connected in parallel with a current source 14. Current flow through either gate conductor, G10 or G12, of cryotrons K10 and K12, respectively, determines the instantaneous state of the multivibrator. This gate current flow is shifted from one to the other of the working gate conductors by means of current flow through the proper one of the associated control conductors C10 and C12. This control conductor current flow is directed by means of programmable feedback network in series with each of the gate conductors and both of the control conductors. As shown in the universal superconductive multivibrator schematic of FIG. 1, the gate conductor of each working cryotron is connected in series with the control conductor of the other working cryotron by means of a coupling cryotron and also in series with its associated control conductor by means of a blocking cryotron and an inductor. Specifically, gate G10 is connected in series with C12 by means of a gate conductor, G16, of coupling cryotron K16 and also in series with its associated control conductor, C10, by means of a gate conductor, G18, of blocking cryotron K18 and an inductor 20. In a similar manner, gate G12 is connected in series with C10 by means of a gate conductor, G22, of coupling cryotron K22 and also in series with its associated control conductor, C12, by means of a gate conductor, G24, of blocking cryotron K24 and an inductor 26.

In the circuit shown in FIG. 1, each of the gate conductors of the coupling cryotrons, K16 and K22, which function as the thin film resistors as necessary, exhibit a value of resistance, when the associated control conductors are energized, that is small relative to the value of resistance exhibited by the gate conductors of the working cryotrons. Conversely, the gate conductors of the blocking cryotrons K18 and K24 exhibit a value of resistance, when the associated control conductors are energized, that is large relative to the value of resistance exhibited by the gate conductors of the working cryotrons. This latter feature is shown in FIG. 1 by indicating control conductors C18 and C24 as traversing the entire length of gate conductors G18 and G24, respectively. In this manner, the coupling cryotrons function to connect the gate conductor of one working cryotron in series with the control conductor of the other working cryotron through either a superconducting or resistive path and the blocking cryotrons are effective to switch the inductor, in series therewith, either into or out of the circuit.

Referring again to the circuit of FIG. 1, it is seen that current from source 14 flows to a junction 27 and thence either through G10 to a junction 28 or through G12 to a junction 30. From junctions 28 and 30, current flows to ground through one or the other control conductors of the working cryotrons, depending on the conduction state of the coupling and blocking cryotrons. Before proceeding with the detailed description of the operation of the circuit, the following assumptions as to circuit parameters are made for the purpose of clarity and as an aid in understanding the operation of the circuit only, it being understood that the various parameters may have a wide range of values. First, each pair of similar cryotrons, that is the working, coupling, and blocking cryotrons, exhibit identical characteristics. Each pair of cryotrons has the same value of gate resistance and the same value of control inductance, as is generally the case. Next, inductors 20 and 26 are chosen to have the same value of inductance, which is relatively high as compared with the inductance of the control conductors, the exact value being selected together with the value of resistance of the gate conductors of coupling cryotrons K16 and K22, as will be understood from the detailed description of circuit operation to follow.

As has been stated above, the universal superconductive multivibrator circuit of the invention is selectively operable in either the astable, monostable, or bistable mode, by means of the selective energization or de-energization of particular ones of the control conductors of the coupling and blocking cryotrons. In the description next following, the operation of the circuit of FIG. 1 in each of these modes is described in detail. Further, the circuit of FIG. 1 is redrawn, as necessary, as an aid in understanding the circuit operation.

In order to operate the circuit of FIG. 1 as an astable multivibrator, it is sufficient to energize C16 and C22, switching G16 and G22, respectively, to the resistive conduction state, and to de-energize C18 and C24, allowing G18 and G24 to remain superconducting. In the astable mode, the circuit of FIG. 1 is then equivalent to the schematic circuit of FIG. 2*a*, wherein the various elements are identified using designations corresponding to those used in FIG. 1 with the letter "*a*" appended. Referring now to FIG. 2*a*, current from source 14*a* flows first to junction 27*a* and then to ground through one of a pair of parallel paths. The first of these includes gate conductor 10*a* of cryotron K10*a*, and a junction 28*a*. From junction 28*a*, the current flows through one of a further pair of parallel paths, the first of which includes inductor 20*a* and control conductor C10*a*. The second of the parallel paths originating from junction 28*a* includes the resistive gate conductor G16*a*, of cryotron K16*a*, indicated as resistor K16*a*, and control conductor C12*a*. The second path between junction 27*a* and ground includes gate conductor G12 and junction 30*a*. Again, from junction 30*a* the current flows through one of a further pair of parallel paths, the first including inductor 26*a* and control conductor C12*a*, and the second including the resistive gate conductor G22*a* of cryotron K22*a* indicated as resistor K22*a* and control conductor C10*a*.

It should be noted that the circuit of FIG. 2*a* is that of an astable multivibrator and therefore exhibits no static stable state. For the purpose of describing the operation of this circuit, an impulse of current is considered to be delivered by current source 14*a* to junction 27*a* and directed through gate conductor G10*a* to junction 28*a*. At this time, essentially all of the current arriving at junction 28*a* flows through the path which includes resistor K16*a* and control conductor C12*a*. That is, the current arriving at junction 28*a* initially divides between the pair of parallel paths connected thereto, in inverse proportion to the inductance of the path. Since the inductance of inductor 20*a* is large with respect to the inductance of each of the control conductors, and each of the parallel paths contains one of the control conductors, the major portion of the current flows through the lower inductance path containing resistor K16*a* and control conductor C12*a*. With the current from source 14*a* flowing as above described, gate G10*a* is superconducting since no current flows through control C10*a* and gate G12*a* is resistive due to the current flow through control C12*a*. Next, as is understood from circuit theory, the current arriving at junction 28*a* exponentially shifts between the parallel paths, that is, the current through the path including resistor K16*a* decreases and the current through the path containing inductor 20*a* increases. Since inductor 20*a* is preferably fabricated of a superconducting material, all of the current arriving at junction 28*a* tends to be established in the superconducting path containing inductor 20*a* and control C10*a*. However, as the current shift continues the magnitude of the current flowing through control C10*a* reaches a value sufficient to generate a magnetic field which quenches superconductivity in gate G10*a*. Simultaneously, since identical cryotron characteristics have been assumed by way of example, the current flowing through control C12*a* has decreased to a value such that gate G12*a* becomes superconducting. At this time the current from source 14*a* arriving at junction 27*a* is shifted out of the path including the now resistive gate G10*a* and into the path including the now superconducting gate G12*a*. Next, a similar exponential shifting action to that described above takes place. The current flowing through gate G12*a* arrives at junction 30*a* and essentially all of this current flows through the path including resistor K22*a* and control C10*a*, due to the large inductance presented by inductor 26*a* in the alternate path. Again, the current at junction 30*a* begins to exponentially shift between the alternate paths connected thereto increasing the current through inductor 26a and decreasing the current through resistor K22a. This exponential shift of current continues until the magnitude of current flowing through inductor 26a and control C12a reaches a value sufficient to generate a magnetic field which quenches superconductivity in gate G12a. Simultaneously, the current flowing through resistor K22a and control C10a has decreased to a value such that gate G10a is again superconducting. As a result of the shifting actions, the current from source 14a arriving at junction 27a is again directed to the path which includes gate G10a and the cycle continues to repeat, that is, the current oscillates between the path including gate G10a and the path including gate G12a. Output signals may be attained from the circuit illustrated in FIG. 2a as a result of the voltage drop developed across either resistor K16a or resistor K22a.

The output wave form developed across either resistor K16a or K22a is shown in FIG. 2b. As there shown, the wave form is a result of a pair of time constants $T_1$ and $T_2$. Time constant $T_1$ indicates the rise of voltage across the resistor as a result of the current shift between gates G10a and G12a. $T_2$ indicates the exponential decrease in voltage across the resistor as a result of the exponential shift in current between the alternate paths connected to either junction 28a and 30a. Time constants $T_1$ and $T_2$ are defined by Equation 1 and 2 below.

$$T_1=\frac{2(L_g+L_c)}{R_g+R_e} \quad (1)$$

$$T_2\frac{L_e+2L_c}{R_e}\approx\frac{L_e}{R_e} \quad (2)$$

Where $L_g$=the inductance of the gate conductor of a working cryotron;

$L_c$=the inductance of the control conductor of a working cryotron;

$R_g$=the resistance of the gate conductor of a working cryotron;

$R_e$=the resistance of resistor K16a or K22a; and $L_e$=the inductance of inductor 20a or 26a.

Next, in order to operate the circuit of FIG. 1 as a monostable multivibrator, it is necessary only to remove one of the feedback paths by energizing the control conductor of either blocking cryotron K18 or K24, while energizing the control conductor of the oppositely corresponding coupling cryotrons K22 or K16. Since the operation of the circuit is the same in either case, the operation is described with cryotrons K18 and K22 energized, but it should be understood that cryotrons K16 and K24 could alternatively be energized. With C18 and C22 energized, G18 and G22 are switched to the resistive conduction state, and the de-energization of C16 and C24 allows G16 and G24 to remain superconducting. In the monostable state, the circuit of FIG. 1 is then equivalent to the schematic circuit of FIG. 3a, wherein the various elements are identified using designations corresponding to those used in FIG. 1 with the letter "b" appended. As shown in FIG. 3a, current from source 14b flows to junction 27b and then to ground through one of a pair of parallel paths. The first of these includes gate conductor G10b of cryotron K10b and control conductor C12b of cryotron K12b. In the circuit of FIG. 3a, all of the current from source 14b flowing through G10b is caused to flow through C12b under both dynamic and static conditions as a result of inductor 26b and the now resistive gate conductor of cryotron K22b, respectively. The second of these parallel paths includes gate conductor G12b of cryotron K12b, a junction 30b and one of a further pair of parallel paths. The first of these further parallel paths includes the resistive gate conductor G22b of coupling cryotron K22b, indicated in the drawings as resistor K22b and control conductor C10b of cryotron K10b, and the second includes an inductor 26b and control conductor C12b of cryotron K12b. In the stable steady state condition, current from source 14b flows to junction 27b and then to ground through gate G10b and control C12b. With this current flow, gate G10b remains superconducting due to the absence of current flow in control C10b, and gate G12b is maintained resistive due to the current flow through control C12b. To initiate a switching action in the circuit of FIG. 3a, a trigger pulse is applied to a pair of terminals 32b and 34b, the first of which, 32b, is connected to the junction of resistor K22b and control C10b and the second of which, 34b, is connected to ground. With the trigger pulse applied between terminals 32b and 34b, the trigger current flows entirely through the superconducting path provided by control C10b, and is prevented from flowing through resistor K22b due to the parallel combination of inductor 26b and resistive gate G12b. The trigger current flowing through control C10b momentarily quenches superconductivity in gate G10b.

At this time, current from source 14b arriving at junction 27b begins to shift to the second of the parallel paths, flowing through gate G12b to junction 30b. In a similar manner to that explained above with reference to FIG. 2a, essentially all of the current arriving at junction 30b flows through resistor K22b and control C10b, because of the high value of inductance presented by inductor 26b. This shift of current from source 14b out of the path which includes gate G10b and into that which includes gate G12b continues, and the current now flowing through control C10b is effective to maintain gate G10b in the resistive state after the termination of the trigger pulse applied between terminals 32b and 34b. Additionally, since the current has shifted from the stable steady state path, gate G12b becomes superconducting. Next, the current arriving at junction 30b begins to exponentially decrease through the path including resistor K22b and to correspondingly increase through the path including inductor 26b in the manner described above with reference to FIG. 2a. Finally, this exponential shift is effective once more to quench superconductivity in gate G12b, by means of the current from source 14b now flowing through control C12b and to again permit gate G10b to become superconducting as a result of the decreased current flow through control C10b. Under these conditions the current arriving at junction 27b again shifts to the quiescent steady state path and the circuit is returned to the stable steady state condition, remaining in this condition until the next application of a trigger pulse.

An output wave form is attained across resistor K22b. This output wave form is again the function of two time constants $T_3$ and $T_2$ where $T_2$ is defined by Equation 2 and $T_3$ differs slightly from $T_1$ as shown by Equation 3.

$$T_3=\frac{2(L_g+L_c)}{R_g+R_e} \quad (3)$$

However, the output wave shape is slightly modified as shown in FIG. 3b, wherein time constant $T_3$ is employed twice to define the output wave form. Again, as in FIG. 2b, $T_3$ defines the rise time of the output voltage. However, the fall time is determined by $T_2$ only until such time as gate G10b returns to the superconducting condition, at which time the fall time is determined by $T_3$.

Finally, in order to operate the circuit of FIG. 1 as a bistable multivibrator, it is sufficient to energize C18 and C24, switching G18 and G24, respectively, to the resistive conduction state, and to de-energize C16 and C22, allowing G16 and G22 to remain superconducting. In the bistable mode, the circuit of FIG. 1 is then equivalent to the schematic circuit of FIG. 4, wherein the various elements are identified using designations corresponding to those used in FIG. 1 with the letter "c" appended. As shown in FIG. 4, current from source 14c flows to junction 27c and then to ground through one of a pair of parallel paths. The first includes gate conductor G10c of cryotron K10c and control conductor C12c of cryotron K12c. The second path includes gate conductor G12c of cryotron K12c and control conductor C10c of cryotron K10c. Current initially established in one or the other of these parallel paths remains in the established path since this current flows through the gate of a first cryotron and the control of a second cryotron, thus causing the gate of the first cryotron to remain superconducting and maintaining the gate conductor of the second cryotron resistive. The state of the multivibrator of FIG. 4 is altered by the application of trigger pulses to either terminal pairs 32c and 34c or 36c and 38c depending on the state of the multivibrator. Thus, a trigger pulse applied to terminals 32c and 34c is required when current is flowing through gate G10c to quench superconductivity therein, and to shift the current from source 14c through gate G12c. Similarly, a trigger pulse applied to terminals 36c and 38c is required when current flows through gate G12c to quench superconductivity therein and shift the current from source 14c through gate G10c.

It might appear at first that trigger pulses applied to the input terminals could possibly flow through an alternate path in parallel with the control to which the pulses are applied. By way of example, it is desired that the current caused by trigger pulses applied to terminals 32c and 34c flow entirely through control C10c and not through the alternate path provided by gate G12c, gate G10c and control C12c. It can now be seen that this desired current flow is attained, by virtue of the fact that the possible alternate path for the trigger current includes the series connection of both gate conductors, one of which is necessarily resistive in an operating circuit. This last described feature, that an applied trigger pulse necessarily flows only through the control of the associate cryotron, results in a bistable multivibrator which does not require either additional cryotrons or additional controls for the working cryotrons, which are essentially, additional cryotrons.

The above described operation of the universal superconductive multivibrator circuit of the invention is summarized below in Table I, which indicates, for the various operating modes of the circuit, the cryotrons which are energized and de-energized.

*Table I*

| Operating Mode | Energized Cryotrons | De-Energized Cryotrons |
|---|---|---|
| Astable | K16, K22 | K18, K24 |
| Monostable | I. K18, K22 | K16, K24 |
| | II. K16, K24 | K18, K22 |
| Bistable | K18, K24 | K16, K22 |

It is important to note, with particular reference to FIGS. 2b and 3b, that the timing wave forms of the circuit are primarily controlled and determined by passive circuit elements, rather than by physical properties or by physical conditions such as the operating temperature and operating currents. Further, as the methods and apparatus required to attain and maintain the required superconductive temperature are well known to those skilled in the art, they have neither been shown nor described herein.

While the invention has been particularly shown and described with reference to a preferred embodiment thereof, it will be understood by those skilled in the art that various changes in form and details may be made therein without departing from the spirit and scope of the invention.

What is claimed is:

1. A universal superconductive multivibrator circuit operable at a superconductive temperature comprising; first and second current paths including first and second gate elements, respectively; first and second control elements associated with said first and second gate elements, respectively, for applying magnetic fields thereto; a current source; means connecting said source in parallel with said first and second paths; feedback means connected between each of said gate elements and both of said control elements; the input of each of said feedback means connected in series with one of said gate elements and the output of each of said feedback means connected in series with both of said control elements in parallel; and programmable means selectively operable to determine further paths through said feedback means, said programmable means operable to convert said circuit to an astable multivibrator, a monostable multivibrator, and a bistable multivibrator.

2. A universal superconductive multivibrator circuit comprising; a pair of working cryotrons, a pair of coupling cryotrons, a pair of blocking cryotrons, and a pair of impedance means; all of said cryotrons including a gate conductor and a control conductor associated therewith for applying magnetic fields thereto; means maintaining said circuit at a superconductive temperature; a current source means coupling the gate conductors of each of said working cryotrons electrically in parallel with said source; a pair of first circuit means each coupling one of said coupling cryotrons, said blocking cryotrons, and said impedance means electrically in series one to another, and in series with both of said control conductors of said working cryotrons; a pair of second circuit means each coupling one of the gate conductors of said working cryotron in series with the junction of a coupling and blocking cryotron; and conditioning means selectively operable to control the conduction state of all of said coupling and blocking cryotrons, said last named means being operable to convert said circuit to an astable multivibrator, a monostable multivibrator, and a bistable multivibrator.

3. A universal superconductive multivibrator circuit comprising; a pair of working cryotrons, a pair of coupling cryotrons, and a pair of blocking cryotrons; all of said cryotrons including a gate conductor and a control current source; means coupling the gate conductors of each conductor associated therewith for applying magnetic fields thereto; means maintaining said circuit at a superconductive temperature; a current source; means coupling the gate conductors of each of said working cryotrons electrically in parallel with said source; the resistance of the gate conductors of said coupling cryotrons when in the resistive state being less than, and the resistance of the gate conductors of said blocking cryotrons when in the resistive state being greater than, the resistance of the gate conductors of the working cryotrons when in the resistive state; means coupling each gate conductor of one working cryotron through the gate conductor of a coupling cryotron to the control conductor of the other working cryotron and through the gate conductor of a blocking cryotron and an impedance means to the control conductor of said one working cryotron; and conditioning means selectively operable to control the conduction state of all of said coupling and blocking cryotrons, said last named means being operable to convert said circuit to an astable multivibrator, a monostable multivibrator, and a bistable multivibrator.

4. A universal superconductive multivibrator circuit operable at a superconductive temperature comprising; first and second superconductive currents paths coupled in parallel to a current source; first and second feedback means; each of said feedback means connected in series with one of said paths and in magnetic field applying relationship with both of said paths, for determining the state, superconducting or normal, of said paths; said feedback means including a plurality of superconductive switching devices and a plurality of impedance means; and conditioning means for rendering certain ones of said devices resistive and certain others of said devices superconducting, selectively, whereby said circuit is operable as an astable multivibrator, a monostable multivibrator, and as a bistable multivibrator wherein the timing of said multivibrators is determined by selected ones of said devices and impedance means.

5. A universal superconductive multivibrator circuit operable at a superconductive temperature comprising; first and second working cryotrons; first and second coupling cryotrons; first and second blocking cryotrons; first and second inductors; all of said cryotrons including a gate conductor and a control conductor associated therewith to control the conduction state thereof; a current source; means coupling the gate conductors of said first and second working cryotrons in parallel with said source; means coupling the gate conductors of said first coupling cryotron and said first blocking cryotron and said first inductor in series to form a first feedback network; means coupling said second inductor and the gate conductors of said second blocking cryotron and said second coupling cryotron in series to form a second feedback network; means coupling said first and second feedback networks in series between the control conductors of said first and second working cryotrons; means coupling the gate conductors of said first and second working cryotrons to the junction of said first coupling and blocking cryotrons and to the junction of said second coupling and blocking cryotrons, respectively; conditioning means for energizing selected ones of the control conductors of said coupling and blocking crytrons to render said circuit operable as an astable multivibrator, a monostable cryotron and as a bistable multivibrator; and means coupling input signals to the control conductors of said first and second working cryotrons.

6. A superconductive switching circuit operable at a superconductive temperature comprising; first and second superconductive gate elements; first and second control elements associated with said first and second gate elements, respectively, for employing magnetic fields thereto; a current source having first and second terminals; means maintaining said circuit at a superconductive temperature; superconductive circuit means coupling each of said first and second gate elements in parallel with said first terminal of said source and coupling each of said first and second control elements in parallel with said second terminal of said source; circuit means coupling said first and second gate elements in series with said second and first control elements, respectively; and further circuit means coupling at least one of said first and said gate element in series with the control element associated therewith, said further circuit means being further effective to couple impedance means in series with said one gate element in each of said first and second control elements.

7. The circuit of claim 5 wherein said last named means and said conditioning means are effective in combination to direct said input signals through the control conductors of said first and second working cryotrons only.

8. An astable superconductive multivibrator circuit operable at a superconductive temperature comprising; first and second working cryotrons each including a gate conductor and a control conductor associated therewith to control the conduction state thereof; first and second resistance elements; first and second impedance elements; a current source; means coupling the gate conductors of said first and second working cryotrons in parallel with said source; means coupling said first resistance and said first impedance elements in series to form a first feedback network; means coupling said second resistance and said second impedance elements in series to form a second feedback network; means coupling said first and second feedback networks in parallel one to another and in series between the control conductors of said first and second working cryotrons; and means coupling the gate conductors of said first and second working cryotrons to the junction of said first resistance and impedance elements and to the junction of said second resistance and impedance elements, respectively, whereby current from said source flows through the gate conductor of one of said working cryotrons and then the gate conductor of the other of said working cryotrons, alternatively, at a rate determined by the magnitude of said resistance and impedance elements.

9. A monostable superconductive multivibrator circuit operable at a superconductive temperature comprising; first and second working cryotrons each including a gate conductor and a control conductor associated therewith to control the conduction state thereof; a resistance element; an impedance element; a current source; means coupling the gate conductors of said first and second working cryotrons in parallel with said source; means coupling said resistance and said impedance elements in series between the control conductors of said first and second working cryotrons; means coupling the gate conductor of said first working cryotron in series with the control conductor of said second working cryotron and the gate conductor of said second working cryotron to the junction of said resistance and impedance elements; and means coupling input signals to the control conductor of said first working cryotron, the resistance of said last named control conductor being very much less than the resistance of said resistance element whereby substantially all of said input signals flow through said control conductor, only.

10. The circuit of claim 9 wherein the control conductor of said first working cryotron is superconducting at said superconductive temperature.

References Cited by the Examiner

UNITED STATES PATENTS 2,958,836 11/60 McMahon ____________ 307—88.5

ARTHUR GAUSS, *Primary Examiner.*

GEORGE N. WESTBY, *Examiner.*